(12) United States Patent
Koch

(10) Patent No.: US 6,331,487 B2
(45) Date of Patent: Dec. 18, 2001

(54) REMOVAL OF POLISHING RESIDUE FROM SUBSTRATE USING SUPERCRITICAL FLUID PROCESS

(75) Inventor: Robert Koch, Fremont, CA (US)

(73) Assignee: Tokyo Electron Limited, Tokyo (JP)

(*) Notice: Subject to any disclaimer, the term of this patent is extended or adjusted under 35 U.S.C. 154(b) by 0 days.

(21) Appl. No.: 09/796,300

(22) Filed: Feb. 27, 2001

Related U.S. Application Data

(63) Continuation of application No. 09/407,628, filed on Sep. 28, 1999.
(60) Provisional application No. 60/101,988, filed on Sep. 28, 1998.

(51) Int. Cl.$^7$ .............................. H01L 21/00; B44C 1/22
(52) U.S. Cl. ................................ 438/692; 134/2; 134/26; 134/36; 134/31; 216/88; 252/79.1; 252/79.3; 252/79.4; 252/79.5; 438/745; 438/753
(58) Field of Search ............................ 438/690, 692, 438/693, 745, 753; 216/38, 88, 89, 91; 134/1.3, 2, 26, 34, 36; 252/79.1, 79.3, 79.4, 79.5

(56) References Cited

U.S. PATENT DOCUMENTS

| | | | |
|---|---|---|---|
| 2,617,719 | 11/1952 | Stewart | 23/312 |
| 3,890,176 | 6/1975 | Bolon | 156/2 |
| 3,900,551 | 8/1975 | Bardoncelli et al. | 423/9 |
| 4,029,517 | 6/1977 | Rand | 134/11 |
| 4,091,643 | 5/1978 | Zucchini | 68/18 C |

(List continued on next page.)

FOREIGN PATENT DOCUMENTS

| | | |
|---|---|---|
| 0 283 740 A2 | 9/1988 | (EP). |
| 0 302 345 A2 | 2/1989 | (EP). |
| 0 370 233 A1 | 5/1990 | (EP). |
| 0 391 035 | 10/1990 | (EP). |
| 0 536 752 A2 | 4/1993 | (EP). |

(List continued on next page.)

OTHER PUBLICATIONS

J.B. Rubin et al. "A Comparison of Chilled DI Water/Ozone and Co2–Based Supercritical Fluids as Replacements for Photoresist–Stripping Solvents" 1998, pp. 308–314, IEEE/CPMT Int'l Electronics Manufacturing Technology Symposium.

"Los Almos National Library," Solid State Technology, pp. S10 & S14, Oct. 1998.

(List continued on next page.)

Primary Examiner—William A. Powell
(74) Attorney, Agent, or Firm—Haverstock & Owens LLP

(57) ABSTRACT

A method of removing polishing residue from a substrate includes placing the substrate in a pressure chamber, pressurizing the pressure chamber, and maintaining the supercritical fluid in contact with the substrate until the polishing residue is removed from the substrate. Following removal of the polishing residue from the substrate, the pressure chamber is flushed and vented.

3 Claims, 1 Drawing Sheet

U.S. PATENT DOCUMENTS

| | | | |
|---|---|---|---|
| 4,341,592 | 7/1982 | Shortes et al. | 156/643 |
| 4,474,199 | 10/1984 | Blaudszun | 134/105 |
| 4,475,993 | 10/1984 | Blander et al. | 204/64 T |
| 4,601,181 | 7/1986 | Privat | 68/18 C |
| 4,693,777 | 9/1987 | Hazano et al. | 156/345 |
| 4,749,440 | 6/1988 | Blackwood et al. | 156/646 |
| 4,788,043 | 11/1988 | Kagiyama et al. | 422/292 |
| 4,838,476 | 6/1989 | Rahn | 228/180.1 |
| 4,865,061 | 9/1989 | Fowler et al. | 134/108 |
| 4,879,004 | 11/1989 | Oesch et al. | 203/89 |
| 4,923,828 | 5/1990 | Gluck et al. | 437/225 |
| 4,924,892 | 5/1990 | Kiba et al. | 134/123 |
| 4,944,837 | 7/1990 | Nishikawa et al. | 156/646 |
| 4,960,140 | 10/1990 | Ishijima et al. | 134/31 |
| 4,983,223 | 1/1991 | Gessner | 134/25.4 |
| 5,011,542 | 4/1991 | Weil | 134/38 |
| 5,013,366 | 5/1991 | Jackson et al. | 134/1 |
| 5,068,040 | 11/1991 | Jackson | 210/748 |
| 5,105,556 | 4/1992 | Kurokawa et al. | 34/12 |
| 5,143,103 | 9/1992 | Basso et al. | 134/98.1 |
| 5,158,704 | 10/1992 | Fulton et al. | 252/309 |
| 5,174,917 | 12/1992 | Monzyk | 252/60 |
| 5,185,058 | 2/1993 | Cathey, Jr. | 156/656 |
| 5,185,296 | 2/1993 | Morita et al. | 437/229 |
| 5,193,560 | 3/1993 | Tanaka et al. | 134/56 R |
| 5,213,619 | 5/1993 | Jackson et al. | 134/1 |
| 5,215,592 | 6/1993 | Jackson | 134/1 |
| 5,225,173 | 7/1993 | Wai | 423/2 |
| 5,236,602 | 8/1993 | Jackson | 210/748 |
| 5,237,824 | 8/1993 | Pawliszyn | 62/51.1 |
| 5,261,965 | 11/1993 | Moslehi | 134/1 |
| 5,266,205 | 11/1993 | Fulton et al. | 210/639 |
| 5,267,455 | 12/1993 | Dewees et al. | 68/5 C |
| 5,274,129 | 12/1993 | Natale et al. | 549/349 |
| 5,288,333 | 2/1994 | Tanaka et al. | 134/31 |
| 5,290,361 | 3/1994 | Hayashida et al. | 134/2 |
| 5,294,261 | 3/1994 | McDermott et al. | 134/7 |
| 5,304,515 | 4/1994 | Morita et al. | 437/231 |
| 5,306,350 | 4/1994 | Hoy et al. | 134/22.14 |
| 5,313,965 | 5/1994 | Palen | 134/61 |
| 5,316,591 | 5/1994 | Chao et al. | 134/34 |
| 5,334,332 | 8/1994 | Lee | 252/548 |
| 5,334,493 | 8/1994 | Fujita et al. | 430/463 |
| 5,337,446 | 8/1994 | Smith et al. | 15/21.1 |
| 5,352,327 | 10/1994 | Witowski | 156/646 |
| 5,355,901 | 10/1994 | Mielnik et al. | 134/105 |
| 5,356,538 | 10/1994 | Wai et al. | 210/634 |
| 5,364,497 | 11/1994 | Chau et al. | 156/645 |
| 5,368,171 | 11/1994 | Jackson | 134/147 |
| 5,370,740 | 12/1994 | Chao et al. | 134/1 |
| 5,377,705 | 1/1995 | Smith, Jr. et al. | 134/95.3 |
| 5,401,322 | 3/1995 | Marshall | 134/13 |
| 5,403,621 | 4/1995 | Jackson et al. | 427/255.1 |
| 5,403,665 | 4/1995 | Alley et al. | 428/447 |
| 5,417,768 | 5/1995 | Smith, Jr. et al. | 134/10 |
| 5,456,759 | 10/1995 | Stanford, Jr. et al. | 134/1 |
| 5,470,393 | 11/1995 | Fukazawa | 134/3 |
| 5,482,564 | 1/1996 | Douglas et al. | 134/18 |
| 5,494,526 | 2/1996 | Paranjpe | 134/1 |
| 5,500,081 | 3/1996 | Bergman | 156/646.1 |
| 5,501,761 | 3/1996 | Evans et al. | 156/344 |
| 5,514,220 | 5/1996 | Wetmore et al. | 134/22.18 |
| 5,522,938 | 6/1996 | O'Brien | 134/1 |
| 5,526,834 | 6/1996 | Mielnik et al. | 134/105 |
| 5,533,538 | 7/1996 | Marshall | 134/104.4 |
| 5,547,774 | 8/1996 | Gimzewski et al. | 428/694 ML |
| 5,550,211 | 8/1996 | DeCrosta et al. | 528/480 |
| 5,580,846 | 12/1996 | Hayashida et al. | 510/175 |
| 5,589,082 | 12/1996 | Lin et al. | 216/2 |
| 5,589,105 | 12/1996 | DeSimone et al. | 252/351 |
| 5,629,918 | 5/1997 | Ho et al. | 369/112 |
| 5,632,847 | 5/1997 | Ohno et al. | 156/344 |
| 5,635,463 | 6/1997 | Muraoka | 510/175 |
| 5,637,151 | 6/1997 | Schulz | 134/2 |
| 5,641,887 | 6/1997 | Beckman et al. | 546/26.2 |
| 5,656,097 | 8/1997 | Olesen et al. | 134/1 |
| 5,665,527 | 9/1997 | Allen et al. | 430/325 |
| 5,679,169 | 10/1997 | Gonzales et al. | 134/1.3 |
| 5,679,171 | 10/1997 | Saga et al. | 134/3 |
| 5,683,977 | 11/1997 | Jureller et al. | 510/286 |
| 5,688,879 | 11/1997 | DeSimone | 526/89 |
| 5,700,379 | 12/1997 | Biebl | 216/2 |
| 5,726,211 | 3/1998 | Hedrick et al. | 521/61 |
| 5,730,874 | 3/1998 | Wai et al. | 210/638 |
| 5,739,223 | 4/1998 | DeSimone | 210/634 |
| 5,783,082 | 7/1998 | DeSimone et al. | 210/634 |
| 5,797,719 | 8/1998 | James et al. | 417/46 |
| 5,798,438 | 8/1998 | Sawan et al. | 528/483 |
| 5,804,607 | 9/1998 | Hedrick et al. | 521/64 |
| 5,866,005 | 2/1999 | DeSimone et al. | 210/634 |
| 5,868,856 | 2/1999 | Douglas et al. | 134/2 |
| 5,868,862 | 2/1999 | Douglas et al. | 134/26 |
| 5,872,257 | 2/1999 | Beckman et al. | 546/336 |
| 5,873,948 | 2/1999 | Kim | 134/19 |
| 5,881,577 | 3/1999 | Sauer et al. | 68/5 |
| 5,888,050 | 3/1999 | Fitzgerald et al. | 417/46 |
| 5,900,354 | 5/1999 | Batchelder | 430/395 |
| 5,908,510 | 6/1999 | McCullough et al. | 134/2 |
| 5,932,100 | 8/1999 | Yager et al. | 210/634 |
| 5,944,996 | 8/1999 | DeSimone et al. | 210/634 |
| 5,965,025 | 10/1999 | Wai et al. | 210/634 |
| 5,976,264 | 11/1999 | McCullough et al. | 134/2 |
| 5,980,648 | 11/1999 | Adler | 134/34 |
| 6,017,820 | 1/2000 | Ting et al. | 438/689 |
| 6,024,801 | 2/2000 | Wallace et al. | 134/1 |
| 6,114,044 | 9/2000 | Houston et al. | 428/447 |
| 6,149,828 | 11/2000 | Vaarststra | 216/57 |
| 6,242,165 | 6/2001 | Vaarststra | 430/329 |

FOREIGN PATENT DOCUMENTS

| | | |
|---|---|---|
| 0 572 913 A1 | 12/1993 | (EP) . |
| 0 587 168 A1 | 3/1994 | (EP) . |
| 0 726 099 A2 | 3/1994 | (EP) . |
| 60-192333 | 9/1985 | (JP) . |
| 62-125619 | 6/1987 | (JP) . |
| 1045131 | 2/1989 | (JP) . |
| 2-148841 | 6/1990 | (JP) . |
| 2-304941 | 12/1990 | (JP) . |
| 7142333 | 6/1995 | (JP) . |
| 727711 | 2/1996 | (JP) . |
| 8222508 | 8/1996 | (JP) . |
| WO 90/06189 | 6/1990 | (WO) . |
| WO 90/13675 | 11/1990 | (WO) . |
| WO 99/49998 | 10/1999 | (WO) . |

OTHER PUBLICATIONS

"Supercritical Carbon Dioxide Resist Remover, SCORR, the Path to Least Photoresistance," Los Almos National Laboratory, 1998.

Guan, Z. et al., "Fluorocarbon–Based Heterophase Polymeric Materials. 1. Block Copolymer Surfactants for Carbon Dioxide Applications," Macromolecules, vol. 27, 1994, pp. 5527–5532.

International Journal of Environmentally Conscious Design & Manufacturing, vol. 2, No. 1, 1993, p. 83.

Matson and Smith "Supercritical Fluids", Journal of the American Ceramic Society, vol. 72, No. 6, pp. 872–874.

Ziger, D.H. et al., "Compressed Fluid Technology: Application to RIE Developed Resists,"AIChE Journal, vol. 33, No. 10, Oct. 1987, pp 1585–1591.

Kirk–Othmer, "Alcohol Fuels to Toxicology," Encyclopedia of Chemical Technology, 3rd ed., Supplement Volume, 1984, pp. 872–893.

"Cleaning with Supercritical $CO_2$," NASA Tech Briefs, MFS–29611, Marshall Space Flight Center, Alabama, Mar. 1979.

Basta, N., "Supercritical Fluids: Still Seeking Acceptance," Chemical Engineering, vol. 92, No. 3, Feb/ 24, 1985, p. 14.

Takahashi, D., "Los Alomos Lab Finds Way to Cut Chip Toxic Waste," Wall Street Journal. Jun. 22,1998.

"Supercritical CO2 Process Offers Less Mess from Semiconductor Plants", Chemical Engineering Magazine, pp. 27 & 29, Jul. 1998.

Sun, Y.P. et al., "Preparation of Polymer–Protected Semiconductor Nanoparticles Through the Rapid Epansion of Supercritical Fluid Solution," Chemical Physics Letters, pp. 585–588, May 22, 1998.

Jackson, K. et al., "Surfactants and Micromulsions in Supercritical Fluids," Supercritical Fluid Cleaning, Noyes Publications, Westwood, NJ, pp. 87–120, Spring 1998.

Kryzsewski, M., "Production of Metal and Semiconductor Nanoparticles in Polymer Systems," Polymery, pp. 65–73, Feb. 1998.

Baker, G.L. et al., "Surface Cleaning and Carbonaceous Film Removal Using High Pressure, High Temperature Water, and Water/CO2 Mixtures," J. Electrochem/Soc, vol. 145, No. 1, pp. 284–291, Jan. 1998.

Ober, C.K. et al., "Imaging Polymers with Supercritical Carbon Dioxide," Advanced Materials, vol. 9, No. 13, 1039–1043, Nov. 3, 1997.

Russick, E.M. et al., "Supercritical Carbon Dioxide Extraction of Solvent from Micromachined Structures." Supercritical Fluids Extraction and Pollution Prevention, ACS Symposium Series, vol. 670, pp. 255–269,Oct. 21, 1997.

Dahmen, N. et al., "Supercritical Fluid Extraction of Grinding and Metal Cutting Waste Contaminated with Oils," Supercritical Fluids—Extraction and Pollution Prevention, ACS Symposium Series, vol. 670, pp. 270–279, Oct. 21, 1997.

Wai, C.M., "Supercritical Fluid Extraction: Metals as Complexes," Journal of Chromatograhy A, vol. 785, pp. 369–383, Oct. 17, 1997.

Xu, C. et al, "Submicron–Sized Spherical Yttrium Oxide Based Phosphors Prepared by Supercritical CO2–Assisted aerosolization and pyrolysis," Appl. Phys. Lett., vol. 71, No. 12, Sep. 22, 1997, pp. 1643–1645.

Tomioka Y , et al., "Decomposition of Tetramethylammonium (TMA) in a Positive Photoresist Developer by Supercritical Water," Abstracts of Papers 214th ACS Natl Meeting, American Chemical Society, Abstract no. 108, Sep. 7, 1997.

Klein, H. et al., "Cyclic Organic Carbonates Serve as Solvents and Reactive Diluents," Coatings World, pp. 38–40, May 1997.

Bühler, J. et al., Liner Array of Complementary Metal Oxide Semiconductor Double–Pass Metal Micromirrors, Opt. Eng., vol. 36, No.5, pp. 1391–1398, May 1997.

Jo, M.H. et al., Evaluation of SIO2 Aerogel Thin Film with Ultra Low Dielectric Constant as an Intermetal Dielectric, Microelectronic Engineering, vol. 33, pp. 343–348, Jan. 1997.

McClain, J.B. et al., "Design of Nonionic Surfactants for Superficial Carbon Dioxide,"Science, vol. 27, Dec. 20, 1996. pp. 2049–2052.

Znaidi, L. et al., "Batch and Semi–Continous Synthesis of Magnesium Oxide Powders from Hydrolysis and Supercritical Treatment of Mg(OCH3)2," Materials Research Bulletin, vol. 31, No. 12, pp. 1527–1335, Dec. 1996.

Tadros, M.E., "Synthesis of Titanium Dioxide Particles in Supercritical CO2," J. Supercritical Fluids, vol. 9, pp. 172–176, Sep. 1996.

Courtecuisse, V.G. et al., "Kinetics of the Titanium Isopropoxide Decomposition in Supercritical Isopropyl Alcohol," Ind. Eng. Chem. Res., vol. 35, No. 8, pp. 2539–2545, Aug. 1996.

Gabor, A, et al., "Block and Random Copolymer resists Designed for 193 nm Lithography and Environmentally Friendly Supercritical CO2 Development," Dept. Mat. Sci. & Eng. Cornell Univ., SPIE, vol. 2724, pp. 410–417, Jun. 1995.

Schimek, G. L. et al., "Supercritical Ammonium Synthesis and Characterization if Four New Alkali Metal Silver Antimony Studies . . . " J. Solid State Chemistry, vol. 123 pp. 277–284, May 1996.

Gallagher–Wetmore, P. et al., "Supercritical Fluid Processing: Opportunities for New Resist Materials and Processes," IBM Research Division, SPIE, vol. 2725, pp. 289–299, Apr. 1996.

Papathomas, K.J. et al., "Debonding of Photoresists by Organic Solvents," J. Applied Polymer Science, vol. 59, pp. 2029–2037, Mar. 28, 1996.

Watkins, J.J. et al., "Polymer/metal Nanocomposite Synthesis in Supercritical CO2," Chemistry of Materials, vol. 7, No. 11, Nov. 1995., pp. 1991–1994.

Gloyna, E.F. et al., "Supercritical Water Oxidation Research and Development Update," Environment Progress, vol. 14, No. 3. pp. 182–192, Aug. 1995.

Gallagher–Wetmore, P. et al., "Supercritical Fluid Processing: A New Dry Technique for Photoresist Developing," IBM Research Division, SPIE vol. 2438, pp.694–708, Jun. 1995.

Gabor, A. H. et al., "Silicon–Containing Block Copolymer Resist Materials," Microelectronics Technology—Polymers for Advanced Imaging and Packaging, ACS Symposium Series, vol. 614, pp. 281–298, Apr. 1995.

Tsiartas, P.C. et al., "Effect of Molecular weight Distribution on the Dissolution Properties of Novolac Blends," SPIE, vol. 2438, pp. 264–271, 1995.

Allen, R.D. et al., "Performance Properties of Near–monodisperse Novolak Resins,"SPIE, vol. 2438, pp. 250–260, 1995.

Wood, P.T. et al., "Synthesis of New Channeled Structures in Supercritical Amines . . . ," Inorg. Chem., vol. 33, pp. 1556–1558, 1994.

Jerome, J.E. et al., "Synthesis of New Low–Dimensional Quaternary Compounds . . . ," Inorg. Chem, vol. 33, pp. 1733–1734, 1994.

McHardy, J. et al., "Progress in Supercritical CO2 Cleaning," SAMPE Jour., vol. 29, No. 5, pp. 20–27, Sep. 1993.

Purtell, R, et al., Precision Parts Cleaning using Supercritical Fluids, J. Vac. Sci, Technol. A. vol. 11, No. 4, Jul. 1993, pp. 1696–1701.

Bok, E, et al., "Supercritical Fluids for Single Wafer Cleaning," Solids State Technology, pp. 117–120, Jun. 1992.

Adschiri, T. et al., "Rapid and Continuous Hydrothermal Crystallization of Metal Oxide Particles in Supercritical Water," J. Am. Ceram. Soc., vol. 75 No. 4, pp. 1019–1022, 1992.

Hansen, B.N. et al., "Supercritical Fluid Transport—Chemical Deposition of Films,"Chem. Mater., vol. 4, No. 4, pp, 749–459, 1992.

Page, S.H. et al., "Predictability and Effect of Phase Behavior of CO2/ Propylene Carbonate in Supercritical Fluid Chromatography," J. Microl. Sep, vol. 3, No. 4, pp. 355–369.

Brokamp, T. et al., "Synthese and Kristallstruktur Eines Gemischvalenten Lithium–Tanalnitrids Li2Ta3Ns," J. Alloys and Compounds, vol. 176. pp. 47–60, 1991.

Hybertson, B.M. et al., "Deposition of Palladium Films by a Novel Supercritical Fluid Transport Chemical Deposition Process," Mat. Res. Bull., vol. 26, pp. 1127–1133, 1991.

Ziger, D. H. et al., "Compressed Fluid Technology: Application to RIE–Developed Resists," AiChE Jour., vol. 33, No. 10, pp. 1585–1591, Oct. 1987.

Matson, D.W. et al., "Rapid Expansion of Supercritical Fluid Solutions: Solute Formation of Powders, Thin Films, and Fibers," Ind. Eng. Chem. Res., vol. 26, No. 11, pp. 2298–2306, 1987.

Tolley, W.K. et al., "Stripping Organics from Metal and Mineral Surfaces using Supercritical Fluids," Separation Science and Technology, vol. 2+3, pp. 1087–1101, 1987.

"Final Report on the Safety Assessment of Propylene Carbonate," J. American College of Toxicology, vol. 6, No. 1, pp. 23–51, 1987.

REMOVAL OF POLISHING RESIDUE FROM SUBSTRATE USING SUPERCRITICAL FLUID PROCESS

RELATED APPLICATIONS

This application is a continuation of U.S. patent application Ser. No. 09/407,628, filed on Sep. 28, 1999, which claims priority from U.S. Provisional Application No. 60/101,988, filed on Sep. 28, 1998, both of which are incorporated by reference.

FIELD OF THE INVENTION

The present invention relates to the field of removing polishing residue from a substrate. More particularly, the present invention relates to the field of removing polishing residue from a substrate using a supercritical fluid.

BACKGROUND OF THE INVENTION

Manufacture of semiconductor devices commonly employ a Chemical Mechanical Polishing (CMP) process to planarize a wafer surface. The CMP process removes top surface layers from a semiconductor wafer. The CMP process leaves a CMP residue of CMP chemicals and particles that is difficult and problematic to remove by current post-CMP cleaning methods. It is well known that the CMP residue predominantly remains in surface features on the wafer surface.

The current post-CMP cleaning methods require that the wafer surface be mechanically washed or brushed by a commercially available machine called a scrubber. The scrubber may employ heat or ultrasonic augmentation and typically requires immersion times of two to twenty minutes to achieve complete removal of the CMP residue from the wafer surface. Because the wafer surface is mechanically washed or brushed by the scrubber, the scrubber leaves defects or scratches in the wafer surface.

It is well known that, if some of the CMP residue remains in the surface features, performance of the semiconductor devices will be degraded. Additionally, it is well known that the cost of manufacturing a wafer of the semiconductor devices is proportional to the time employed for each processing step.

It would be advantageous to be able to remove the CMP residue without using the mechanical washing or brushing employed by the scrubber in order to reduce an amount of the defects and the scratches. Further, it would be advantageous to more effectively remove the CMP residue from the surface features on the wafer surface.

What is needed is a method of removing polishing residue that does not use the mechanical washing or brushing.

What is further needed is a method of removing polishing residue that is more effective than the mechanical washing or brushing in removing the polishing residue from the surface features.

What is additionally needed is a method of removing the polishing residue that is more efficient than the scrubber.

SUMMARY OF THE INVENTION

The present invention is a method of removing polishing residue from a surface of a semiconductor substrate. The semiconductor substrate, including the polishing residue on the surface, is placed within a pressure chamber. The pressure chamber is then pressurized. Supercritical carbon dioxide and a solvent are introduced into the pressure chamber. The supercritical carbon dioxide and the solvent are maintained in contact with the semiconductor substrate until the polishing residue is removed from the semiconductor substrate. The pressure chamber is then flushed and vented.

DETAILED DESCRIPTION OF THE PREFERRED EMBODIMENT

Figure 1:
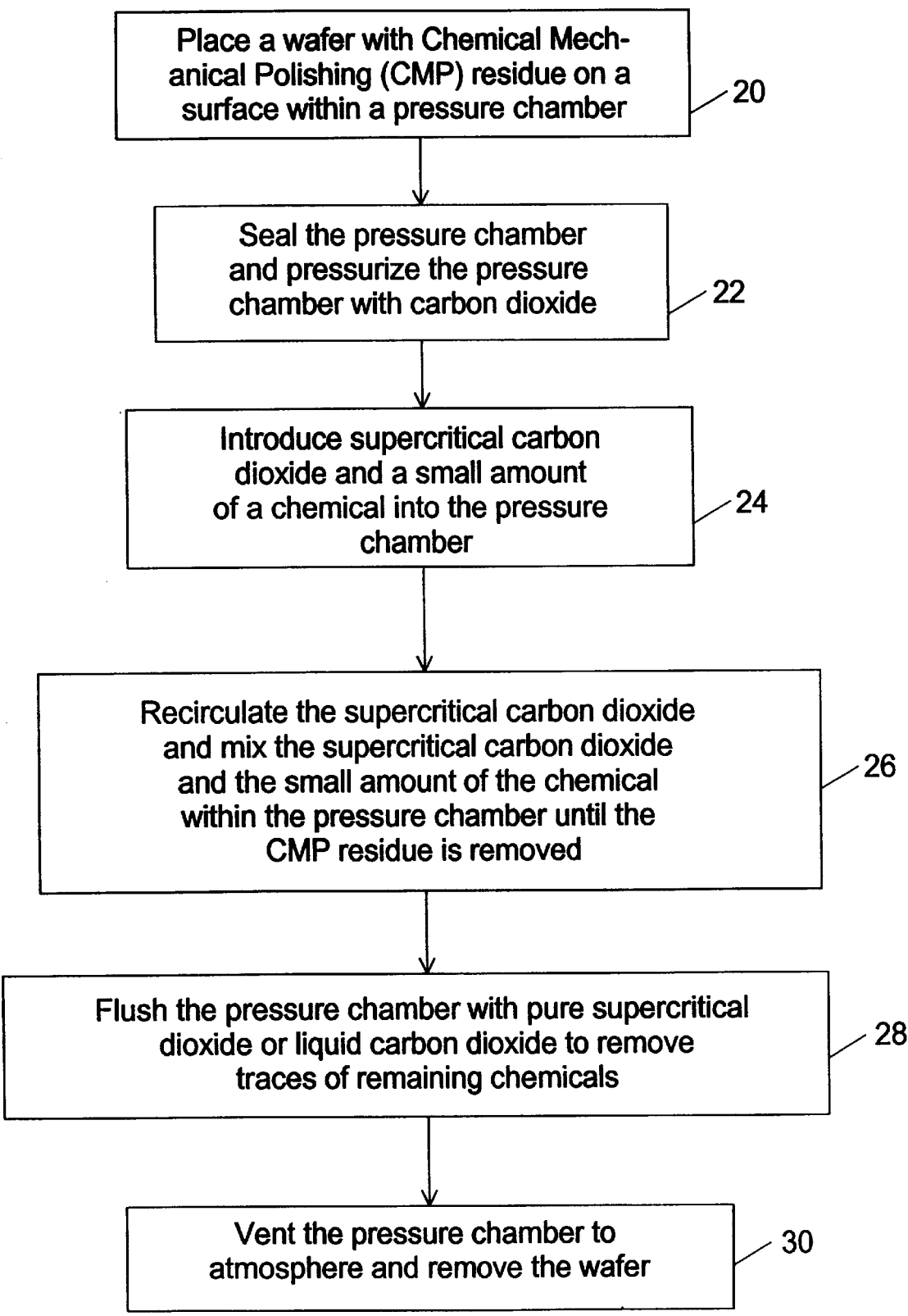
FIG. 1 is a flow chart illustrating the steps of a method of the present invention.

The present invention utilizes high solvency and cleaning characteristics of supercritical carbon dioxide to assist in a post-CMP cleaning process. In the preferred embodiment, a small amount of a chemical, i.e., a solvent or a solvent mixture, is added to affect the post-CMP cleaning process as compared to the prior art. In the present invention, the supercritical carbon dioxide carries a small amount of the chemical to a wafer surface to be cleaned and is then recycled back to a carbon dioxide compressor for reuse.

The chemical is soluble or insoluble in carbon dioxide and is not damaging to semiconductor device materials. The high solvency and solubilizing ability of the supercritical carbon dioxide makes this method fast, safe, and very quick. High turbulence at wafer surface features in conjunction with hyper-efficient mass transport of a chemical co-solvent package can clean the wafer surface in less than five minutes. CMP residue of CMP chemicals and abrasive particles is effectively removed without direct mechanical contact, in contrast to current methods. Another advantage of the present invention is that the wafer surface contains fewer defects as compared to mechanical scrubber methods.

The solvency of supercritical carbon dioxide increases with pressure. Diffusivity and viscosity at or above a critical point of carbon dioxide remains similar to that of a gas phase. Because density above the critical point of the carbon dioxide is nearly equal to that of a liquid state, the supercritical carbon dioxide carries the chemical onto the wafer surface and cleans sub-micron surface features of a modern semiconductor device. In the present invention, the supercritical carbon dioxide also functions to carry away the CMP residue, including the CMP chemicals and abrasive particles, from the sub-micron surface features of the modern semiconductor device. Thus, a small amount of the chemical mixed with the supercritical carbon dioxide performs the post-CMP cleaning process and also cleans away any remaining unwanted chemicals and the CMP residue.

The preferred embodiment of the post-CMP cleaning process of the present invention is illustrated in FIG. 1. The semiconductor wafer including the CMP residue is placed in a pressure chamber in a first process step 20. The pressure chamber is then sealed and pressurized with the carbon dioxide, in a second process step 22. As the pressure inside the pressure chamber builds, the carbon dioxide becomes liquid and then reaches supercritical temperature and pressure. Typical conditions for this process range from 20 to 70° C. and 1050 and 6000 psig. When the desired conditions are reached, a small amount of the chemical is introduced into a supercritical carbon dioxide stream and thus added into the pressure chamber to begin cleaning, in a third process step 24. Typical types and amounts of chemicals are:

a. 0.1–15.0 v/v % of isopropyl alcohol and related alcohols;

b. 0.1–15.0 v/v % of propylene carbonate and related carbonates;

c. 0.1–15.0 v/v % of ethylene glycol and related glycols;
d. 0.001–5.0 v/v % of ozone;
e. 0.1–15.0 v/v % of hydrogen fluoride and related fluorides;
f. 0.1–15.0 v/v % of ammonium hydroxide and related hydroxides;
g. 0.1–15.0 v/v % of citric acid and related acids; and
h. 0.1–15.0 v/v % of a mixture of any of the above chemicals.

The chemical is preferably selected from a preferred group including the isopropyl alcohol, the propylene carbonate, the ethylene glycol, the ozone, the hydrogen fluoride, the ammonium hydroxide, and the citric acid, or a mixture thereof.

The chemical is alternatively selected from an alternative group including the alcohols related to the isopropyl alcohol, the carbonates related to the propylene carbonate, the glycols related to the ethylene glycol, the fluorides related to the hydrogen fluoride, the hydroxides related to the ammonium hydroxide, and the acids related to the citric acid, or a mixture selected from these chemicals and the preferred group.

The post-CMP cleaning process continues with recirculation of the supercritical carbon dioxide and with mixing, i.e., agitating, thereof inside the pressure chamber until the CMP residue is removed, typically from one-half to five minutes, in a fourth process step 26. The pressure chamber is then flushed with pure supercritical carbon dioxide or liquid carbon dioxide to remove all traces of any remaining chemicals, in a fifth process step 28. Finally, the chamber is vented to atmosphere and the wafer is removed, in a sixth process step 30. At this point, an optional rinse in DI (deionized) or ultra pure water may be performed to finish the cleaning process.

The present invention uses the supercritical carbon dioxide in combination with the small amount of a chemical admixture to remove the CMP residue from the surfaces of the semiconductor devices in a post-CMP cleaning system. The post-CMP cleaning system includes a wafer process chamber, a pump, a sensor system, a pressure and flow regulating system, and a recovery chamber. The wafer process chamber holds the semiconductor wafer or semiconductor wafers. The pump is capable of compressing liquid carbon dioxide beyond the critical point. The sensor system measures temperature, pressure and flows. The pressure and flow regulating system connects a carbon dioxide source to the wafer chamber at the desired conditions. The recovery chamber collects solid and liquid material exhausted from the wafer chamber.

The post-CMP cleaning system preferably includes a temperature control system for heating the wafer process chamber.

The post-CMP cleaning system preferably includes a chemical introduction system for adding precise amounts of the chemical into the supercritical carbon dioxide process stream.

The post-CMP cleaning process of the present invention includes the following steps. The wafer is placed in the wafer process chamber. The post-CMP cleaning system is preferably purged with inert gas or the carbon dioxide. Alternatively, the post-CMP cleaning system is not purged. Next, the post-CMP cleaning system is pressurized with the carbon dioxide to achieve supercritical conditions. A desired amount of the chemical is added into the carbon dioxide, which forms chemical laden supercritical carbon dioxide. The chemical-laden supercritical carbon dioxide is contacted with the wafer. The wafer process chamber is preferably flushed using the supercritical carbon dioxide to remove contaminants. Alternatively, the wafer process chamber is flushed using the liquid carbon dioxide. The post CMP cleaning system is then depressurized to allow removal of the wafer.

The post-CMP cleaning process results in the wafer surface having a defect level that is much lower than current cleaning methods, which utilize mechanical contact of the wafer with roller or brush equipment.

The post-CMP cleaning process removes the CMP residue from semiconductors, bare silicon wafers, metallic covered wafers, and memory storage devices. It will be readily apparent to one of ordinary skill in the art that the post-CMP cleaning process removes the CMP residue from other substrates, including other semiconductor substrates, that have been polished or planarized in the CMP process.

It will be readily apparent to one skilled in the art that other various modifications may be made to the preferred embodiment without departing from the spirit and scope of the invention as defined by the appended claims.

What is claimed is:

1. A method of removing a polishing residue from a surface of a substrate comprising the step of maintaining a supercritical fluid in contact with the substrate until the polishing residue is removed from the substrate.

2. A method of removing a polishing residue from a surface of a substrate comprising the step of maintaining supercritical carbon dioxide in contact with the substrate until the polishing residue is removed from the substrate.

3. A method of removing a polishing residue from a surface of a substrate comprising the step of maintaining supercritical carbon dioxide and a solvent in contact with the substrate until the polishing residue is removed from the substrate.

* * * * *

UNITED STATES PATENT AND TRADEMARK OFFICE
CERTIFICATE OF CORRECTION

PATENT NO. : 6,331,487 B2
DATED : December 18, 2001
INVENTOR(S) : William H. Mullee et al.

It is certified that error appears in the above-identified patent and that said Letters Patent is hereby corrected as shown below:

<u>Title page,</u>
Item [56], References Cited, under "FOREIGN PATENT DOCUMENTS", insert
-- 0 836 895 A2   4/1998       (EP) --.

Item [75], Inventor: delete "Robert Koch, Fremont, CA (US)" and insert -- William H. Mullee, Portland, OR; Marc de Leeuwe, Tucson, AZ; and Glenn A. Roberson, Jr., Hollister, CA, all of the United States. --

Signed and Sealed this

Thirtieth Day of July, 2002

*Attest:*

*Attesting Officer*

JAMES E. ROGAN
*Director of the United States Patent and Trademark Office*